United States Patent
Kato

(10) Patent No.: US 8,593,323 B2
(45) Date of Patent: Nov. 26, 2013

(54) A/D CONVERSION DEVICE

(75) Inventor: Shuichi Kato, Tokyo (JP)

(73) Assignees: Olympus Corporation, Tokyo (JP); Denso Corporation, Kariya-shi, Aichi (JP)

( * ) Notice: Subject to any disclaimer, the term of this patent is extended or adjusted under 35 U.S.C. 154(b) by 257 days.

(21) Appl. No.: 13/267,632

(22) Filed: Oct. 6, 2011

(65) Prior Publication Data

US 2012/0075136 A1 Mar. 29, 2012

Related U.S. Application Data

(63) Continuation of application No. PCT/JP2010/002557, filed on Apr. 7, 2010.

(30) Foreign Application Priority Data

Apr. 9, 2009 (JP) ................................ 2009-095010

(51) Int. Cl.
*H03M 1/12* (2006.01)

(52) U.S. Cl.
USPC ............ 341/155; 341/118; 341/120; 341/143

(58) Field of Classification Search
USPC .................. 341/118, 120, 143, 155
See application file for complete search history.

(56) References Cited

U.S. PATENT DOCUMENTS

| | | | |
|---|---|---|---|
| 5,396,247 A * | 3/1995 | Watanabe et al. | 341/157 |
| 6,466,151 B2 * | 10/2002 | Nishii et al. | 341/155 |
| 6,711,202 B2 * | 3/2004 | Morton | 372/87 |
| 6,850,178 B2 * | 2/2005 | Watanabe | 341/155 |
| 6,879,278 B2 * | 4/2005 | Watanabe et al. | 341/155 |
| 6,940,443 B2 * | 9/2005 | Terazawa et al. | 341/157 |
| 6,977,605 B2 * | 12/2005 | Lee et al. | 341/161 |
| 7,612,699 B2 * | 11/2009 | Tanizawa | 341/157 |
| 7,639,169 B2 * | 12/2009 | Tanizawa | 341/155 |
| 8,427,352 B2 * | 4/2013 | Tanizawa | 341/157 |
| 2004/0177102 A1 | 9/2004 | Nakamura et al. | |
| 2006/0232456 A1 | 10/2006 | Morikawa | |

FOREIGN PATENT DOCUMENTS

| | | |
|---|---|---|
| JP | 5-259907 A | 10/1993 |
| JP | 2004-274157 A | 9/2004 |
| JP | 2006-279389 A | 10/2006 |
| JP | 2006-279839 A | 10/2006 |

OTHER PUBLICATIONS

Japanese Notice of Allowance dated Jul. 10, 2012, issued in corresponding Japanese Patent Application No. 2011-508247, (6 pages). With English Translation.

International Search Report of PCT/JP2010/002557, mailing date May 11, 2010.

* cited by examiner

*Primary Examiner* — Linh Nguyen

(74) *Attorney, Agent, or Firm* — Westerman, Hattori, Daniels & Adrian, LLP

(57) ABSTRACT

An A/D conversion device has first to third pulse delay circuits, first to third pulse passage stage detection circuits, a time output circuit, and an output circuit. Each of the first to third pulse delay circuit has multiple stages of delay units which are connected together and delay a first to a third pulse signals, respectively. Each of the first to third pulse passage stage detection circuit detects a first to a third number of stages, respectively. The time output circuit outputs a time signal. The output circuit outputs the digital value corresponding to the third number of stages.

4 Claims, 9 Drawing Sheets

A/D CONVERSION DEVICE

This application is a continuation application based on PCT/JP2010/002557, filed on Apr. 7, 2010, claiming priority based on Japanese Patent Application No. 2009-095010, filed on Apr. 9, 2009. The contents of Japanese patent application and PCT application are incorporated herein.

BACKGROUND OF THE INVENTION

1. Field of the Invention

The present invention relates to an A/D conversion device which converts an analog input voltage to a digital value using a pulse delay circuit, which delays a pulse signal for a delay period according to a magnitude of the analog input voltage.

2. Description of Related Art

In the related art, as an A/D conversion device in which a high-resolution digital value is obtained with a simple configuration, as shown in FIG. 8, an A/D conversion device described in Japanese Unexamined Patent Application, First Publication No. H05-259907 is known. In an A/D conversion device 400 shown in FIG. 8, a pulse delay circuit 11 has a configuration in which a plurality of delay units (NAND1, BUF1, . . . , and BUF15) having various gate circuits are connected together in a ring shape. As the power supply voltage of each delay unit, an analog input voltage Vin which will be subjected to A/D conversion is supplied. If a sampling pulse (SP) is input to the pulse delay circuit 11, the SP sequentially passes through each delay unit with a delay period according to the power supply voltage, and revolves in the pulse delay circuit 11. The number of stages when the SP has passed through the delay units is determined by the delay period of each delay unit, that is, the analog input voltage Vin which is supplied as a power supply voltage. The pulse passage stage detection circuit 21 detects the number of passage stages (and the number of revolutions).

The output circuit 31 loads the detection result of the number of passage stages by the pulse passage stage detection circuit 21 at the same time that a latch pulse (LP) is input when the sampling time has elapsed. The sampling time has started after the input of the SP has started. The output circuit 31 outputs a value obtained by encoding the number of passage stages as a digital value (out) after A/D conversion.

In the A/D conversion device 400, when the analog input voltage Yin is within a predetermined input voltage range (Vmin to Vmax), the relationship between Yin and out becomes linear, as indicated by a line L10 of FIG. 9.

In the A/D conversion device 400, the delay time of the delay unit changes depending on environmental factors, such as temperature, the type of elements, a variation between elements, or the like. As indicated by a line L11 of FIG. 9, the slope (=resolution) of the input/output characteristic varies from the value of the line L10.

The changes will be described specifically. When the input/output characteristic is expressed by the line L10 of FIG. 9, the range in which the A/D conversion result with respect to a predetermined voltage range (Vmin to Vmax) is obtained becomes Δout0. Meanwhile, when the input/output characteristic is expressed by the line L11 of FIG. 9, the range in which the A/D conversion result with respect to a predetermined voltage range (Vmin to Vmax) is obtained becomes Δout1. The sampling time is identical. Since the line L10 and the line L11 are different in slope, as shown in FIG. 9, Δout0 and Δout1 which are the ranges of the A/D conversion results with respect to the same voltage range (Vmin to Vmax) are different in magnitude.

SUMMARY OF THE INVENTION

A first aspect of the invention provides an A/D conversion device which converts an analog input voltage to a digital value. The A/D conversion device including a first pulse delay circuit which receives a first pulse signal at a first time as input, and has multiple stages of delay units which are connected together and delay the first pulse signal for a delay period according to a magnitude of a first analog voltage, a first pulse passage stage detection circuit which detects a first number of stages when the first pulse signal has passed through the delay unit in the first pulse delay circuit, a second pulse delay circuit which receives a second pulse signal at a second time that is the same as the first time, and has multiple stages of delay units which are connected together and delay the second pulse signal for a delay period according to a magnitude of a second analog voltage which is different from the first analog voltage, a second pulse passage stage detection circuit which detects a second number of stages when the second pulse signal has passed through a delay unit in the second pulse delay circuit, a time output circuit which outputs a time signal indicating a time at which a difference between the first number of stages and the second number of stages becomes a predetermined number of stages, a third pulse delay circuit which receives a third pulse signal at a third time as input, at a same time as the first time and the second time as input, and has delay units which are connected together and delay the third pulse signal for a delay period according to a magnitude of the analog input voltage, a third pulse passage stage detection circuit which detects a third number of stages when the third pulse signal has passed through a delay units in the third pulse delay circuit, and an output circuit which outputs the digital value corresponding to the third number of stages detected at a time indicated by the time signal.

According to a second aspect of the invention, the A/D conversion device further includes a memory circuit which stores a sampling time corresponding to the time indicated by the time signal. The third pulse delay circuit further receives a fourth pulse signal at a fourth time after the first time, the second time, and the third time as input. The third pulse passage stage detection circuit further detects a fourth number of stages when the fourth pulse signal has passed through the delay units in a fourth pulse delay circuit. The output circuit further outputs the digital value corresponding to the fourth number of stages detected at a time at which the sampling time stored in the memory circuit has elapsed after the fourth pulse signal has been input.

According to a third aspect of the invention, the A/D conversion device further includes a control circuit which stops a operation of the first pulse delay circuit or the second pulse delay circuit after the sampling time has been stored in the memory circuit.

According to a fourth aspect of the invention, the A/D conversion device further includes a control circuit which stops the operations of the first pulse delay circuit and the second pulse delay circuit after the sampling time has been stored in the memory circuit.

DETAILED DESCRIPTION OF THE INVENTION

Hereinafter, preferred embodiments of the invention will be described with reference to the drawings. The invention is not limited to the following embodiments, and for example, the constituent elements of the embodiments may be appropriately combined together.

<First Embodiment>

Figure 1:
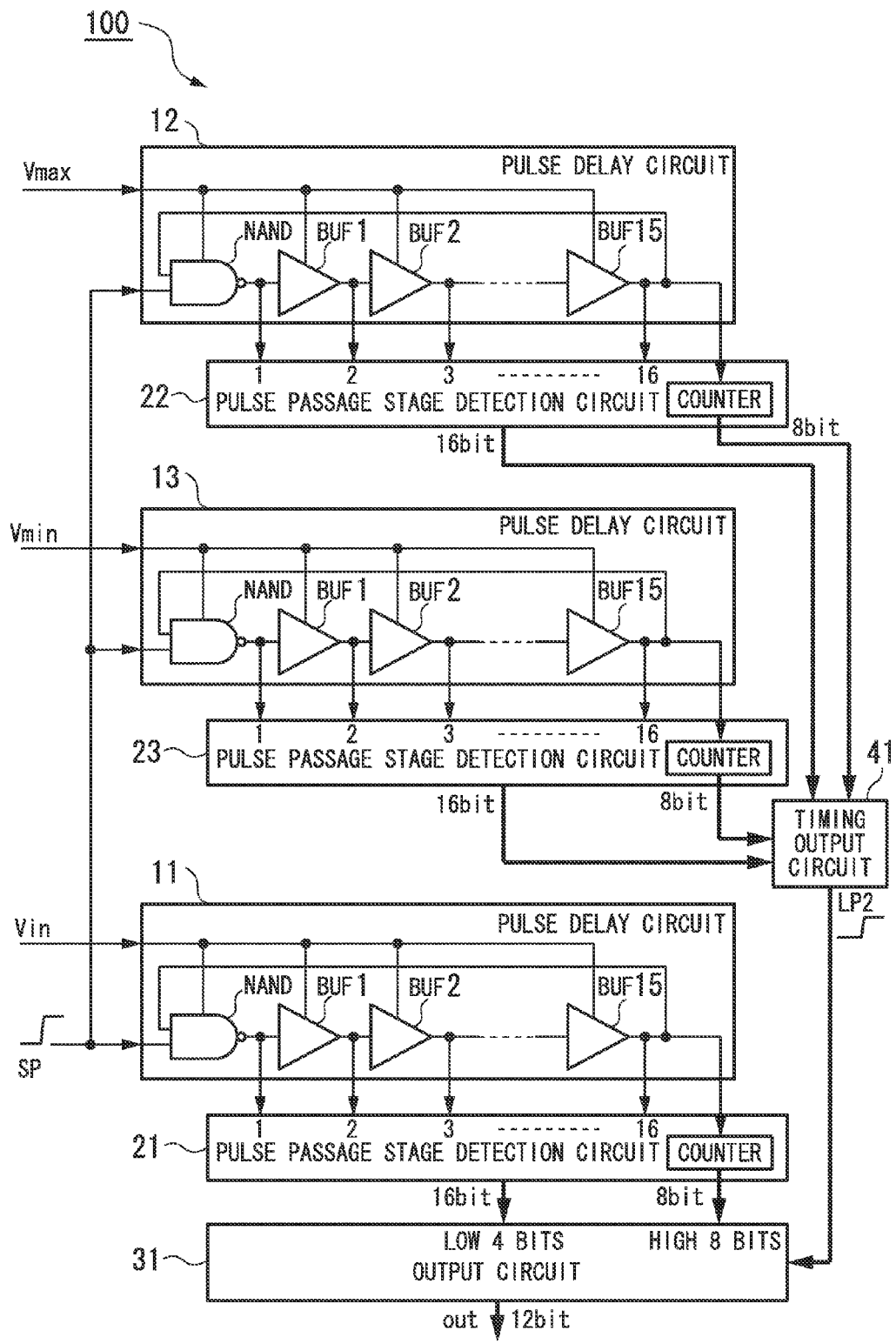
FIG. 1 is a block diagram showing the configuration of an A/D conversion device according to a first embodiment of the invention.

First, a first embodiment of the invention will be described. FIG. 1 shows the configuration of an A/D conversion device of this embodiment. Referring to FIG. 1, an A/D conversion device 100 includes pulse delay circuits 11, 12, and 13, pulse passage stage detection circuits 21, 22, and 23, an output circuit 31, and a time output circuit 41.

The pulse delay circuit 11 has multiple stages of delay units which are connected together and delay a sampling pulse (SP) for a delay period according to the magnitude of Vin (analog input voltage). The pulse delay circuit 12 has multiple stages of delay units which are connected together and delay the SP for a delay period according to the magnitude of a maximum value (Vmax) in the allowable voltage range of Vin. The pulse delay circuit 13 has multiple stages of delay units which are connected together and delay the SP for a delay period according to the magnitude of a minimum value (Vmin) in the allowable voltage range of Vin.

The pulse passage stage detection circuit 21 detects the number of stages when the SP has passed through the delay units in the pulse delay circuit 11. The pulse passage stage detection circuit 22 detects the number of stages when the SP has passed through the delay units in the pulse delay circuit 12. The pulse passage stage detection circuit 23 detects the number of stages when the SP has passed through the delay unit in the pulse delay circuit 13.

The time output circuit 41 generates a latch pulse (LP2) based on the output signals of the pulse passage stage detection circuit 22 and the pulse passage stage detection circuit 23, and outputs the latch pulse (LP2) to the output circuit 31. The output circuit 31 latches the output signal of the pulse passage stage detection circuit 21 based on the LP2, encodes the output signal, and outputs a digital value (out) corresponding to Vin.

Hereinafter, the detailed configuration of the pulse delay circuit 11 will be described. The pulse delay circuit 11 has a configuration in which 16 stages of delay units are connected together in a ring shape to provide a delay amount according to a power supply voltage to an input signal. With this configuration, a ring delay line (RDL) revolves the SP. A first stage delay unit NAND has one input terminal to which the SP is input and another input terminal to which the output of a 16-th stage delay unit BUF15 is input. The delay unit NAND constantly logically inverts the output of the 16-th stage delay unit BUF 15 when the pulse delay circuit 11 is in operation.

Each delay unit of a second stage delay unit BUF1 to the 16-th stage delay unit BUF15 is a gate circuit (for example, a buffer circuit having two stages of NOT gates connected together) which outputs a value input to the input terminal thereof to the output terminal thereof. Vin is applied to each delay unit (NAND1, BUF1, . . . , and BUF15) as the power supply voltage. Each delay unit delays the SP input from a previous stage delay unit for the delay period according to the voltage level of the power supply voltage (Vin), and outputs the SP to a next stage delay unit. The delay units connected together in a ring shape operate in the same manner, and the SP is sequentially transferred from a previous stage to a subsequent stage, such that the SP revolves in the pulse delay circuit 11.

A process in which the SP revolves in the pulse delay circuit 11 will be specifically described below. When the SP is not input to one input terminal of the first stage delay unit NAND (when the SP is at the "L" level), the level of the output terminal of the delay unit NAND is at the "H" level without depending on the input of another input terminal. The level of the output terminal of each delay unit of the second stage delay unit BUF1 and subsequent delay units is at the "H" level.

Subsequently, the SP is input to one input terminal of the first stage delay unit NAND (the SP is at the "H" level). Since the level of another input terminal of the delay unit NAND is at the "H" level by the SP output from the last stage delay unit BUF15, the level of the output terminal of the delay unit NAND is switched to the "L" level with the delay period according to the voltage level of the power supply voltage (Vin). The level of the output terminal of each delay unit of the second stage delay unit BUF1 and subsequent delay units is sequentially switched to the "L" level with the delay period according to the voltage level of the power supply voltage (Vin).

If the level of the output terminal of the last stage delay unit BUF 15 is switched to the "L" level, the level of the output terminal of the first stage delay unit NAND is switched to the "H" level with the delay period according to the voltage level of the power supply voltage (Vin). The level of the output terminal of each delay unit of the second stage delay unit BUF1 and subsequent delay units is sequentially switched to the "H" level with the delay period according to the voltage level of the power supply voltage (Vin).

If the level of the output terminal of the last stage delay unit BUF 15 is switched to the "H" level, in the next revolution, the level of the output terminal is switched to the "L" level in order from the first stage delay unit NAND. Subsequently, while the SP is input, an operation is repeatedly performed such that, each time the level of the output terminal of the last stage delay unit BUF15 is switched, the level of the output terminal is switched to the opposite level in order from the first stage delay unit NAND. As a result, the SP continues to revolve in the pulse delay circuit 11.

The time necessary from when the level of the input terminal of each delay unit is switched until the level of the output terminal is switched becomes the delay period according to Vin which is the power supply voltage of each delay unit. For this reason, the number of stages of delay units through which the SP has passed in a predetermined time depends on the analog input voltage (Vin).

The pulse passage stage detection circuit 21 is a circuit which detects the number of stages when the SP has passed through the delay units in the pulse delay circuit 11. The output signal of each delay unit in the pulse delay circuit 12 is input to the pulse passage stage detection circuit 21.

The pulse passage stage detection circuit 21 outputs, as an 8-bit count value, the count result of a counter when the level of the 16-th stage delay unit BUF15 in the pulse delay circuit 11 is switched from the "H" level to the "L" level or from the "L" level to the "H" level. The pulse passage stage detection circuit 21 outputs 16-bit data indicating the state where the level of the output terminal of each of the 16 stages of delay units of the pulse delay circuit 11 is at the "H" level or the "L" level.

The 8-bit count value and 16-bit data output from the pulse passage stage detection circuit 21 indicate how many times the SP revolves in the pulse delay circuit 11 and to which stage delay unit the SP proceeds. For example, when the count value is 4, the output of the fifth stage delay unit BUF4 is at the "L" level, and the sixth stage delay unit BUF5 is at the "H" level, the number of stages when the SP has passed through the delay units is 16 stages×4+5 stages=69 stages.

As described above, the pulse passage stage detection circuit 21 outputs, as an 8-bit+16-bit digital signal, the number of stages when the SP has passed through the pulse delay circuit 11 having the delay units, to which the analog input voltage (Vin) is applied as the power supply voltage.

The configuration of the pulse delay circuit 12 and the pulse passage stage detection circuit 22 is the same as the configuration of the pulse delay circuit 11 and the pulse passage stage detection circuit 21. The pulse passage stage detection circuit 22 outputs, as an 8-bit+16-bit digital signal, the number of stages when the SP has passed through the pulse delay circuit 12 having the delay units, to which the analog voltage (Vmax) is applied to as the power supply voltage.

The pulse delay circuit 13 and the pulse passage stage detection circuit 23 have the same configuration as the pulse delay circuit 11 and the pulse passage stage detection circuit 21. The pulse passage stage detection circuit 23 outputs, as an 8-bit+16-bit digital signal, the number of stages when the SP has passed through the pulse delay circuit 13 having the delay units, to which the analog voltage (Vmin) is applied as the power supply voltage.

Figure 2:
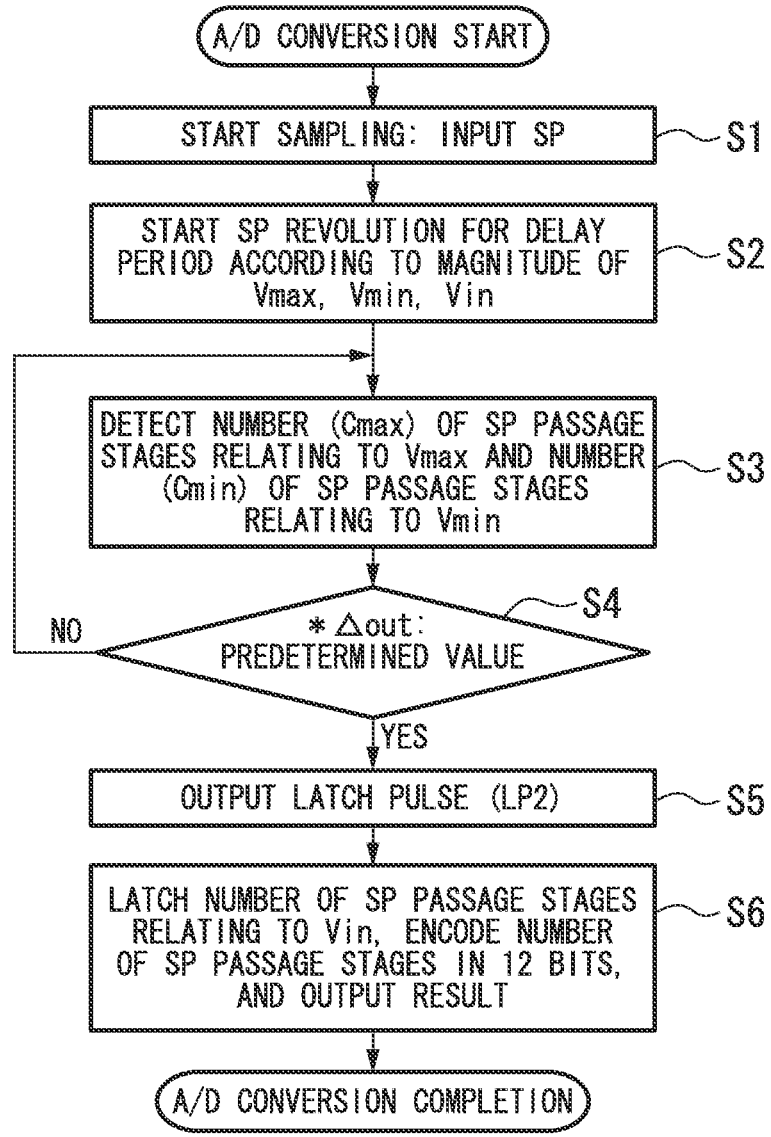
FIG. 2 is a flowchart showing a process procedure of the A/D conversion device according to the first embodiment of the invention.

Next, a process procedure of the A/D conversion device 100 will be described with reference to FIG. 2. First, the SP is simultaneously input to the pulse delay circuits 11, 12, and 13 (the level of the SP is switched from the "L" level to the "H" level) (Step S1). The SP starts to revolve with a different delay period in each of the pulse delay circuits 11, 12, and 13 (a delay period based on Vin in the pulse delay circuit 11, a delay period based on Vmax in the pulse delay circuit 12, and a delay period based on Vmin in the pulse delay circuit 13) (Step S2). Each of the pulse passage stage detection circuits 21, 22, and 23 detects the number of stages when the SP has passed through the delay units (Step S3).

The number of stages when the SP has passed through the delay units in the pulse delay circuit 12 is Cmax, the number of stages when the SP has passed through the delay units in the pulse delay circuit 13 is Cmin, and a predetermined number of stages set in advance is $\Delta$out. The time output circuit 41 outputs the latch pulse (LP2) at the time at which the difference between Cmax and Cmin exceeds $\Delta$out, that is, at the time at which the following expression (1) is satisfied (Step S4) (the level of the LP2 is switched from the "L" level to the "H" level) (Step S5).

$$\Delta out \geq Cmax - Cmin \quad (1)$$

The output circuit 31 latches the number of stages (the count value and the output value of each delay unit) detected by the pulse passage stage detection circuit 21 at the time at which the LP2 from the time output circuit 41 is input (the time at which the level of the LP2 is switched from the "L" level to the "H" level). The output circuit 31 encodes the latched number of stages in 12 bits and outputs the number of stages as the last A/D conversion result (out) (Step S6).

For example, it is assumed that the signal (8-bit+16-bit digital signal) from the pulse passage stage detection circuit 21 represents the following values. The output value of each of 16 stages of delay units="0000000011111111" count value which representing the number of revolutions of the SP="00111110"

In this case, since the count value is 62 in decimal notation, it can be understood that the SP revolves the 16 stages of delay units 62 times. From the output value of each delay unit, it can also be understood that the SP has passed 8 stages of delay units in the 63rd revolution. Thus, the number of passage stages based on Vin becomes 16 stages×62+8 stages=1000 stages. The output circuit 31 outputs a value ("001111101000") obtained by encoding the number of stages to a 12-bit digital signal.

In the A/D conversion device 100 which operates in the above-described manner, the difference (Vmax−Vmin) between Vmax and Vmin is constant, and the predetermined number of stages $\Delta$out is constant. Sampling of Vmax, Vmin, and Vin starts simultaneously, and the number of stages corresponding to Vin is latched at the time at which the number of stages corresponding to the difference Vmax−Vmin becomes $\Delta$out and output as the A/D conversion result (out). Thus, when the input/output characteristic of the output out with respect to the analog input voltage Vin has linearity, the slope (=resolution) of the input/output characteristic becomes constant.

Figure 8:
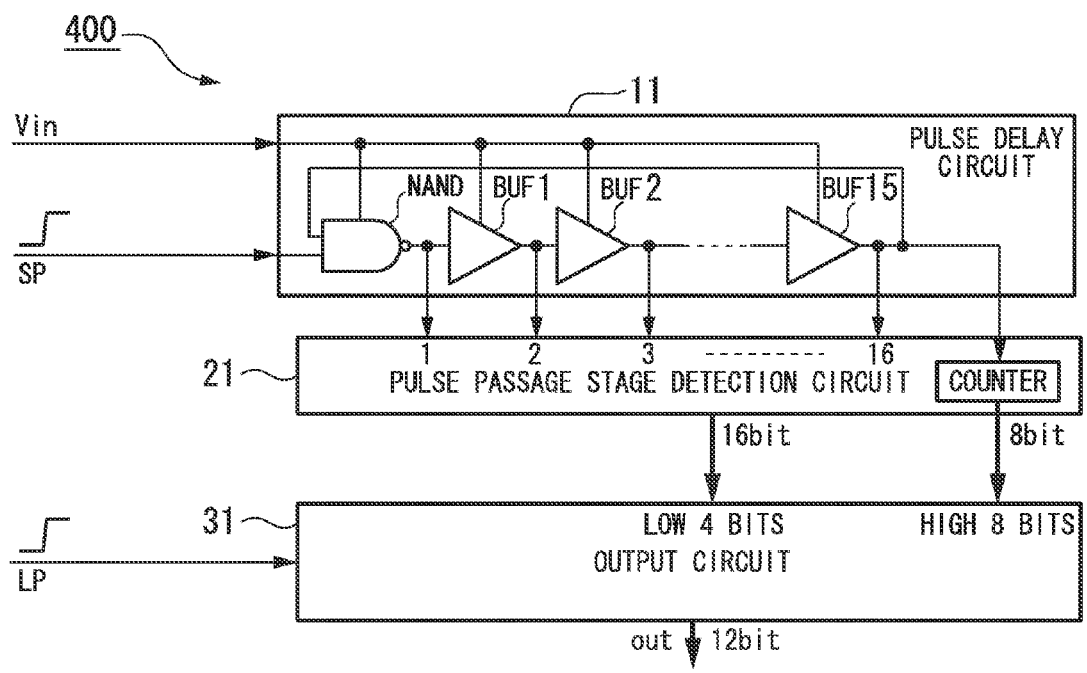
FIG. 8 is a block diagram showing the configuration of an A/D conversion device of the related art.
Figure 9:
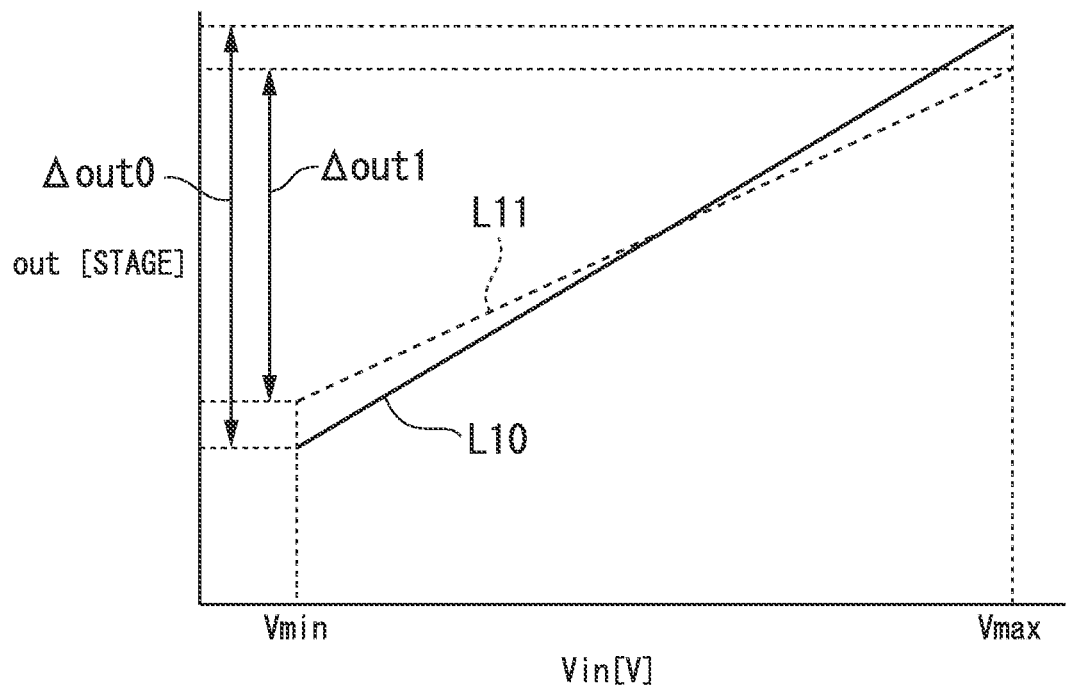
FIG. 9 is a reference diagram showing the input/output characteristic of the A/D conversion device of the related art.

For example, in the above-described A/D conversion device 400 (FIG. 8) of the related art, it is on the assumption that the input/output characteristic at a temperature T1 is the line L10 of FIG. 9, and the input/output characteristic at a temperature T2 is the line L11 of FIG. 9.

When the A/D conversion device 100 of this embodiment is constituted by a pulse delay circuit having the same characteristic as the pulse delay circuit 11 of the A/D conversion device 400, the A/D conversion device 100 operates to delay the output time of the LP2 at the temperature T2 more than the output time of the LP2 at the temperature T1, such that $\Delta$out becomes constant (in FIG. 9, $\Delta$out0=$\Delta$out1) regardless of a change in the slope of the input/output characteristic due to a change in temperature. For this reason, the slope of the input/output characteristic at the temperature T1 coincides with that at the temperature T2.

As described above, according to this embodiment, it is possible to suppress a variation in the slope (resolution) of the input/output characteristic regardless of a variation in temperature or a variation in the characteristic of a transistor constituting the pulse delay circuit.

According to this embodiment, the SP is input to the pulse delay circuits 11, 12, and 13 simultaneously, and sampling of Vmax and Vmin for determining the output time of the LP2 and sampling of desired Vin are performed in parallel, thereby suppressing a variation in the slope (resolution) of the input/output characteristic by single sampling. Therefore, it is possible to obtain the A/D conversion result at high speed. For example, as in this embodiment, instead of determining the time (LP2 output time) at which sampling of Vin ends in real time from the sampling result of Vmax and Vmin, a method is considered in which the sampling time of Vin is determined by sampling twice or more such that sampling of Vmax and Vmin is performed for a given time (T1) by initial sampling and the next sampling time (Ts) of Vin is determined from the sampling result, thereby suppressing a variation in the slope (resolution) of the input/output characteristic.

A specific example will be described. In the first sampling for the given time T1, when the difference between the sampling result of Vmax and the sampling result of Vmin is two times larger than a predetermined value, in the second sampling, feedback is applied such that the sampling time of Vin becomes half (Ts=T/2) of T1. Thus, sampling is performed for a sampling time such that the difference between the sampling result of Vmax and the sampling result of Vmin is substantially constant. As a result, a variation in the slope (resolution) of the input/output characteristic may be suppressed.

However, if sampling is not repeated, a desired result is not obtained, making it difficult to realize high-speed A/D conversion.

According to this embodiment, it is possible to obtain a desired result while suppressing a variation in the slope (resolution) of the input/output characteristic with single sampling, thereby realizing high-speed A/D conversion.

<Second Embodiment>

Figure 3:
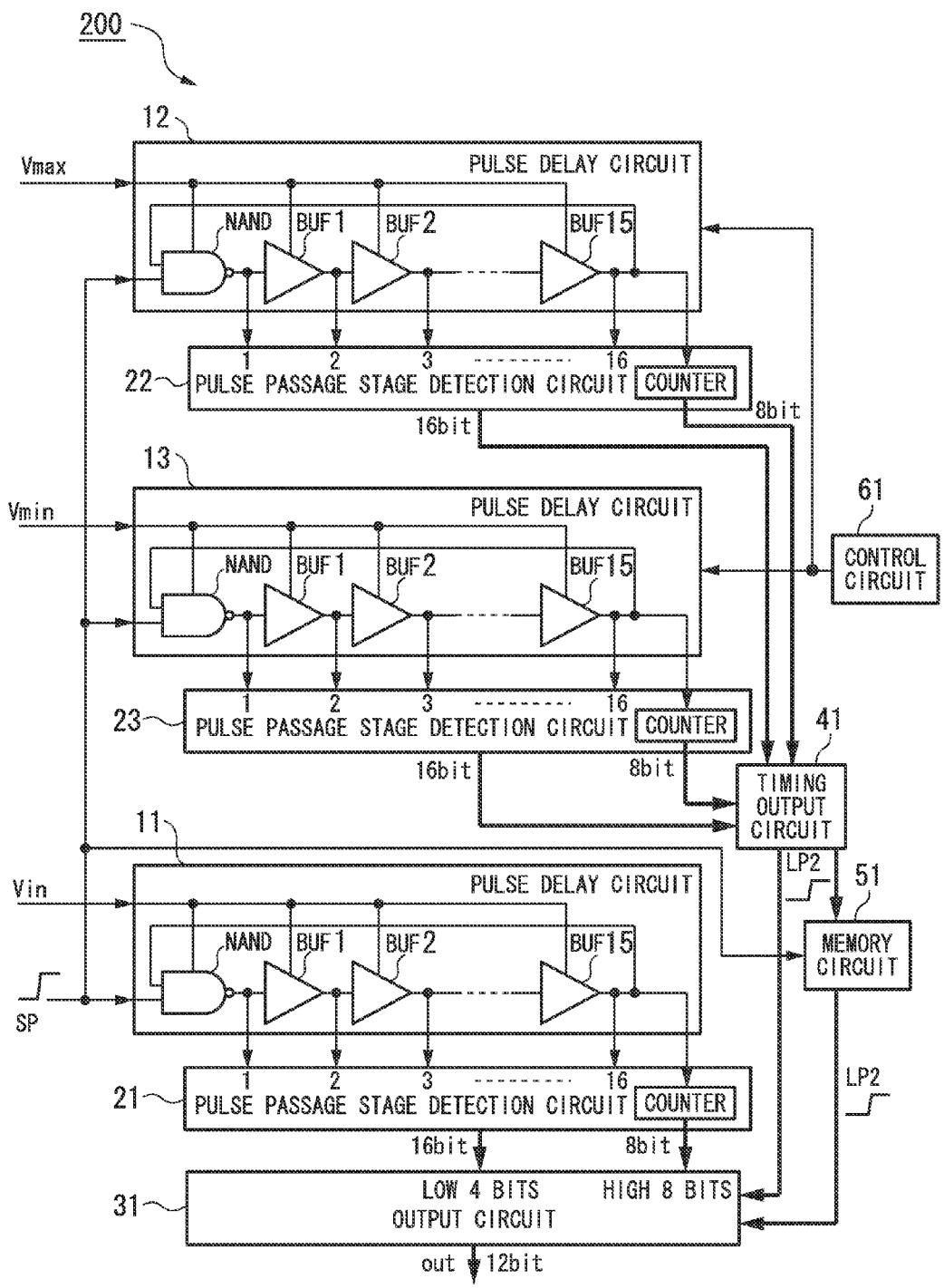
FIG. 3 is a block diagram showing the configuration of an A/D conversion device according to a second embodiment of the invention.

Next, a second embodiment of the invention will be described. FIG. 3 shows the configuration of an A/D conversion device of this embodiment. Referring to FIG. 3, an A/D conversion device 200 includes pulse delay circuits 11, 12, and 13, pulse passage stage detection circuits 21, 22, and 23, an output circuit 31, a time output circuit 41, a memory circuit 51, and a control circuit 61.

The pulse delay circuits 11, 12, and 13, the pulse passage stage detection circuits 21, 22, 23, and the output circuit 31, and the time output circuit 41 have the same configuration as those in the A/D conversion device 100 of the first embodiment. Meanwhile, the time output circuit 41 outputs the latch pulse LP2 to the output circuit 31 and the memory circuit 51.

The memory circuit 51 stores a sampling time based on the SP and the LP2 from the time output circuit 41. The sampling time is the time from when the SP is input to the pulse delay circuits 11, 12, and 13 until the LP2 is output from the time output circuit 41. The control circuit 61 controls the pulse delay circuit 12 and the pulse delay circuit 13.

Figure 4:
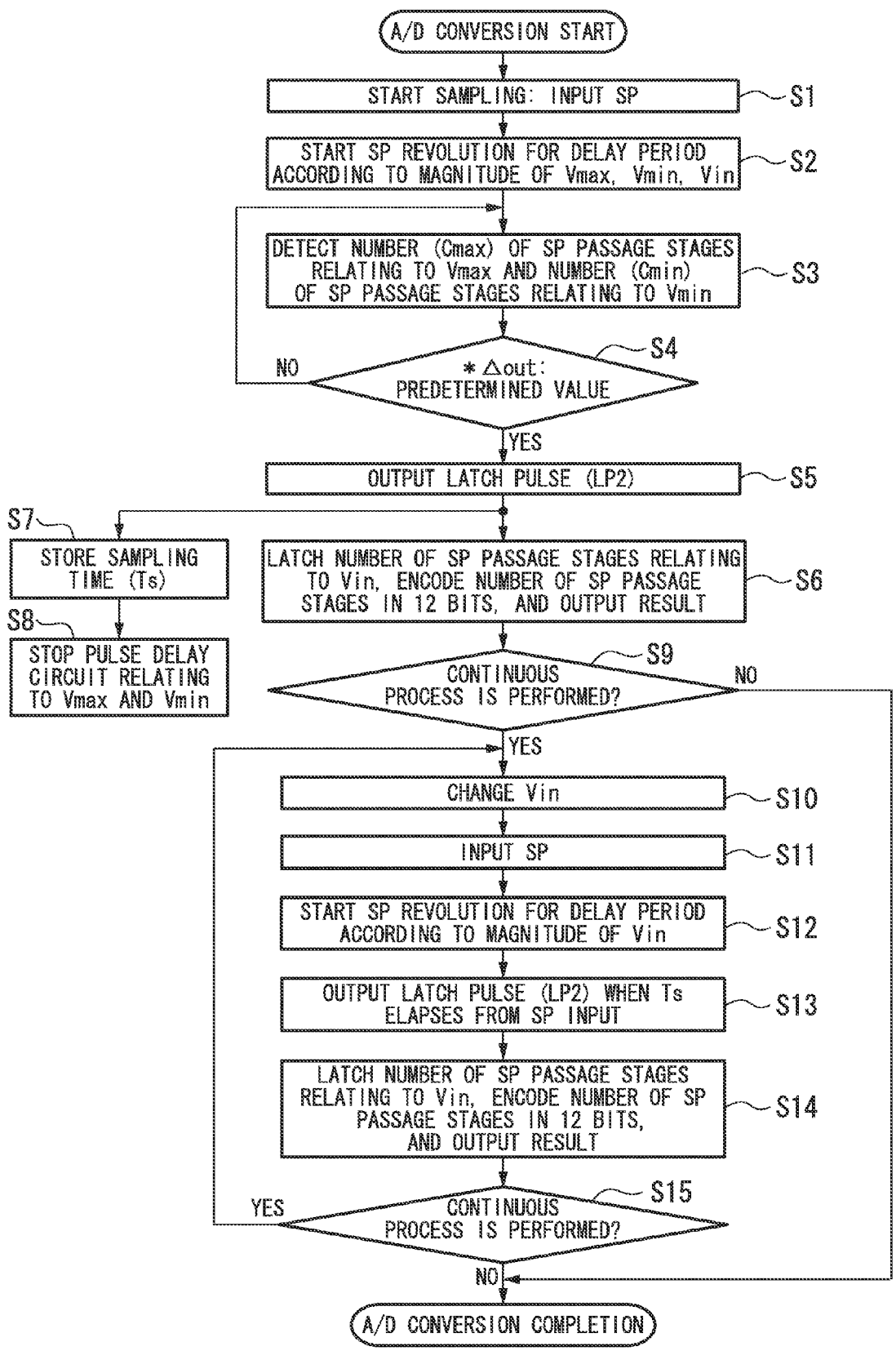
FIG. 4 is a flowchart showing a process procedure of the A/D conversion device according to the second embodiment of the invention.

Next, a process procedure of the A/D conversion device 200 will be described with reference to FIG. 4. The process procedure of Steps S1 to S5 shown in FIG. 4 is the same as the process procedure of Steps S1 to S5 shown in FIG. 2, thus description thereof will be omitted.

Figure 5:
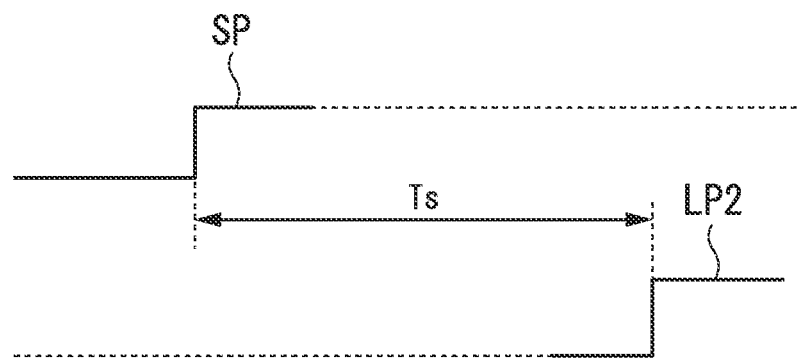
FIG. 5 is a time chart showing the waveforms of a sampling pulse and a latch pulse in the second embodiment of the invention.

In Step S5, if the latch pulse (LP2) is output from the time output circuit 41, the memory circuit 51 stores the time (the sampling time Ts: see FIG. 5) from the time of Step S1 at which the SP is input to the time of Step S5 at which the LP2 is input (Step S7).

Subsequently, the control circuit 61 stops the operations of the pulse delay circuit 12 and the pulse delay circuit 13 (Step S8).

The output circuit 31 latches the number of stages (the count value and the output value of each delay unit) detected by the pulse passage stage detection circuit 21 at the time at which the LP2 from the time output circuit 41 is input (the time at which the level of the LP2 is switched from the "L" level to the "H" level). The output circuit 31 encodes the latched number of stages in 12 bits and outputs the result as the last A/D conversion result (out) (Step S6).

Single A/D conversion is completed with the process up to Step S6. Although the process may be completed at this time, in this embodiment, a continuous A/D conversion process can be performed efficiently. That is, when the continuous process is not performed (Step S9), the process is completed. When the continuous process is performed (Step S9), the process of Steps S10 to S15 is performed. Hereinafter, the continuous process (Steps S10 to S15) will be described.

When the continuous process is performed, first, the value of Vin is changed (Step S10). Meanwhile, when A/D conversion is performed on the same input signal multiple times by oversampling or the like, Step S10 is not necessary.

Subsequently, if the SP is input again (Step S11), the SP starts to revolve around the delay units in pulse delay circuit 11 for the delay period based on Vin (Step S12). The memory circuit 51 outputs the latch pulse (LP2) after the sampling time Ts stored in Step S8 has elapsed and the SP has been input again in Step S11 (Step S13). The output circuit 31 latches the number of stages (the count value and the output value of each delay unit) detected by the pulse passage stage detection circuit 21 at the time at which the LP2 from the memory circuit 51 is input (the level of the LP2 is switched from the "L" level to the "H" level).

The output circuit 31 encodes the latched number of stages in 12 bits and outputs the result as the last A/D conversion result (out) (Step S14).

Subsequently, when the continuous process is repeated, the process of Steps S10 to S14 is repeatedly performed (Step S15).

In the A/D conversion device 200 which operates in the above-described manner, it is possible to make the slope of the input/output characteristic constant. Therefore, according to this embodiment, it is possible to suppress a variation in the slope (resolution) of the input/output characteristic regardless of a variation in temperature or a variation in the characteristic of a transistor constituting the pulse delay circuit.

In this embodiment, as in the foregoing first embodiment, the SP is input to the pulse delay circuits 11, 12, and 13 simultaneously, and sampling of Vmax and Vmin for determining the output time of the LP2 and sampling of desired Vin are performed in parallel. Therefore, it is possible to obtain the first A/D conversion result at high speed.

When A/D conversion is continuously repeated, the output time of the LP2 is stored in the memory circuit 51, thereby stopping the pulse delay circuits 12 and 13. Therefore, it is possible to reduce power consumption. Any one of the pulse delay circuits 12 and 13 may be stopped. In this case, it is possible to reduce power consumption.

<Third Embodiment>

Figure 6:
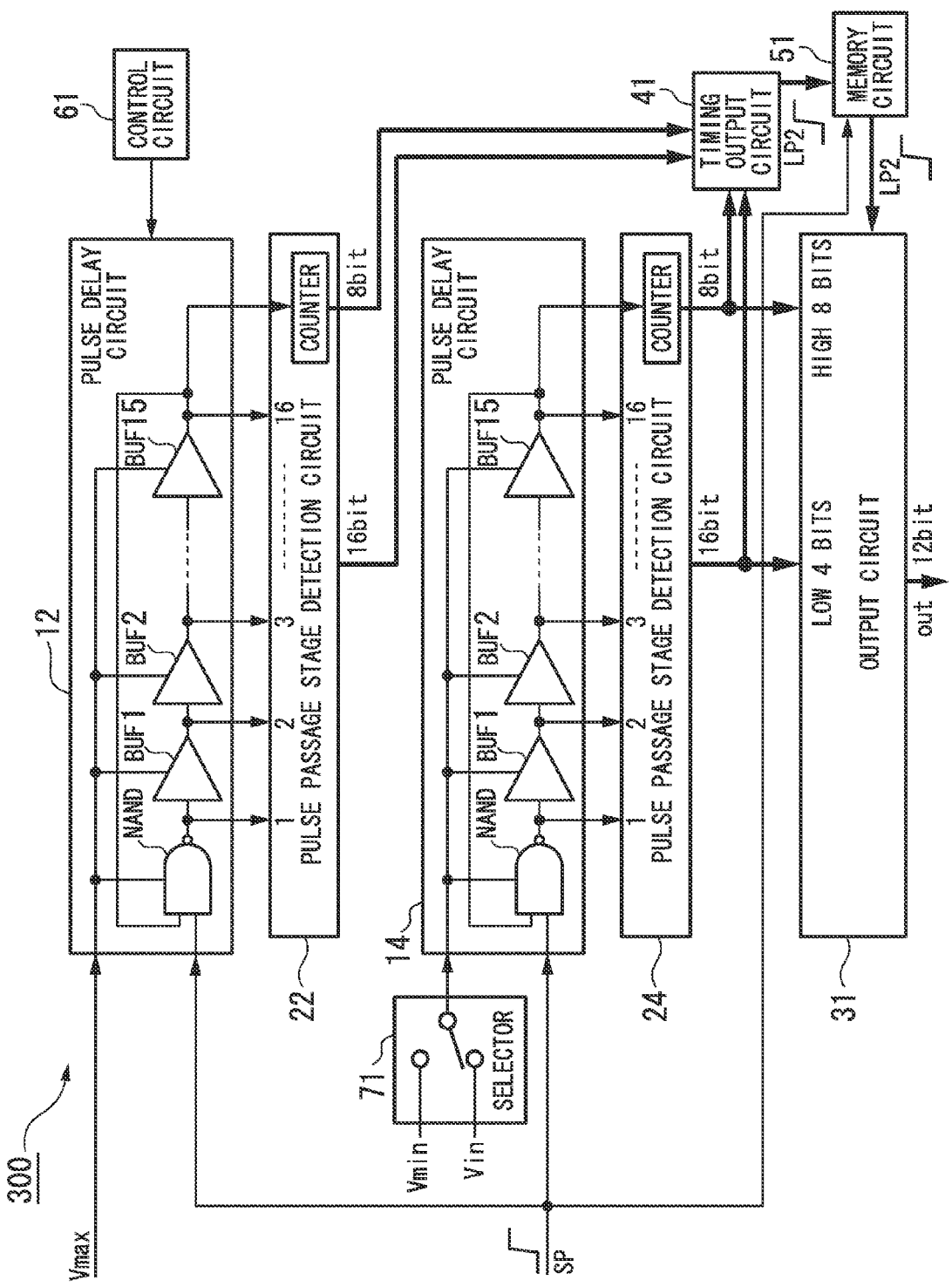
FIG. 6 is a block diagram showing the configuration of an A/D conversion device according to a third embodiment of the invention.

Next, a third embodiment of the invention will be described. FIG. 6 shows the configuration of an A/D conversion device of this embodiment. Referring to FIG. 6, an A/D conversion device 300 includes pulse delay circuits 12 and 14, pulse passage stage detection circuits 22 and 24, an output circuit 31, a time output circuit 41, a memory circuit 51, a control circuit 61, and a selector 71. The pulse delay circuit 12, the pulse passage stage detection circuit 22, the output circuit 31, the time output circuit 41, the memory circuit 51, and the control circuit 61 have the same configuration as those in the A/D conversion device 200 of the second embodiment.

The pulse delay circuit 14 and the pulse passage stage detection circuit 24 have the same configuration as those of the pulse delay circuit 11 and the pulse passage stage detection circuit 21 of the first embodiment. The pulse passage stage detection circuit 24 outputs, as an 8-bit+16-bit digital signal, the number of stages when the SP has passed through the pulse delay circuit 14 having delay units, to which the output voltage of the selector 71 is applied as the power supply voltage. The selector 71 can switch a voltage to be output, and outputs either Vin or Vmin.

Figure 7:
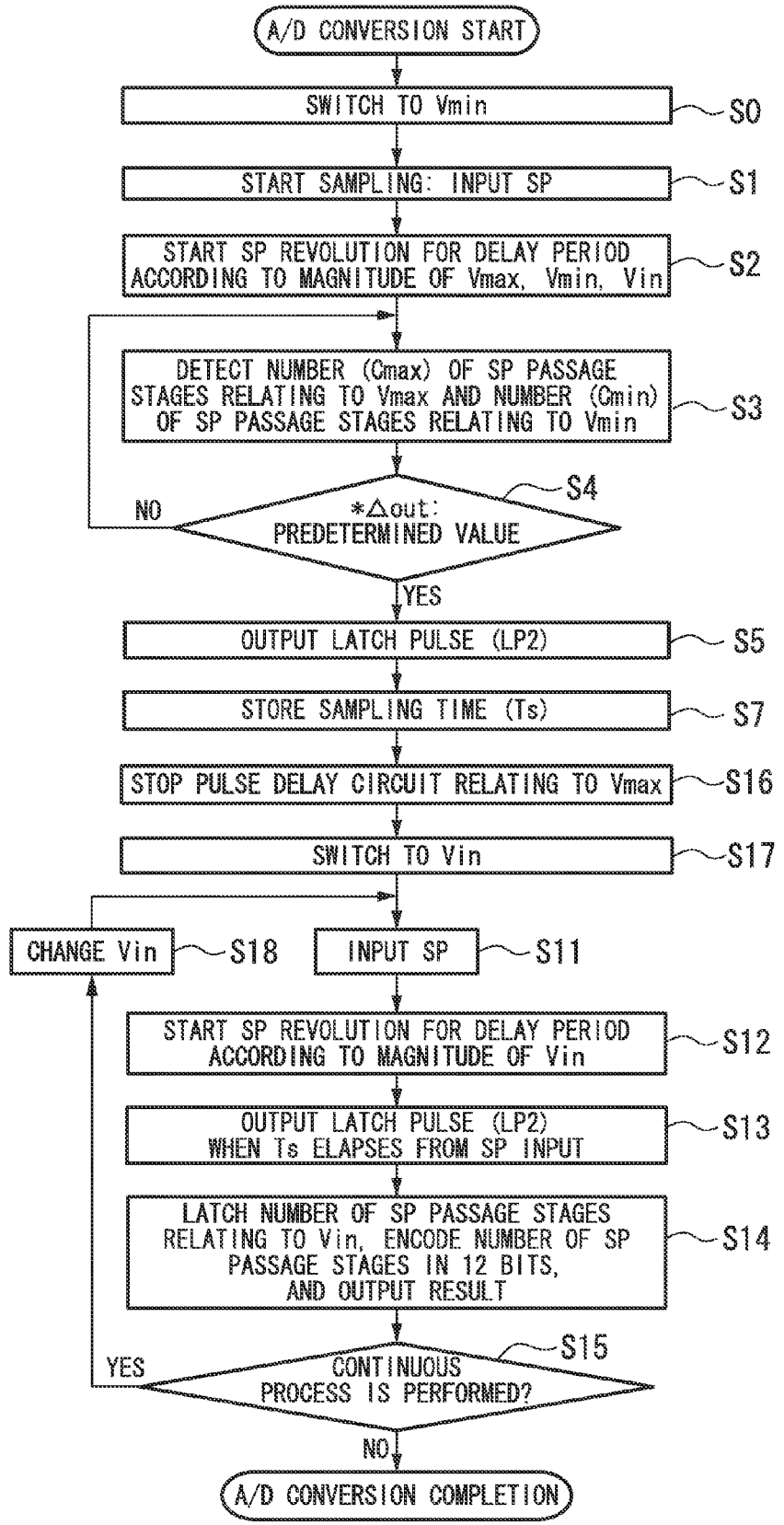
FIG. 7 is a flowchart showing a process procedure of the A/D conversion device according to the third embodiment of the invention.

Next, the process procedure of the A/D conversion device 300 will be described with reference to FIG. 7. First, the output of the selector 71 is switched to Vmin (Step S0). Subsequently, the same process as the process of Steps S1 to S7 shown in FIG. 4 is performed. After, in the Step S7, the sampling time Ts is stored in the memory circuit 51, the control circuit 61 stops the operation of the pulse delay circuit 12 (Step S16).

Subsequently, the output of the selector 71 is switched to Vin (Step S17). Thereafter, the SP is input again, and A/D conversion based on Yin is performed (Steps S11 to S14). The process of Steps S11 to S14 shown in FIG. 8 is the same as the process of Steps S11 to S14 shown in FIG. 4.

When the continuous process is repeated (Step S15), the value of Yin is changed (Step S18), and the process of Steps S11 to S15 is repeated.

In the A/D conversion device 300 which operates in the above-described manner, it is possible to make the slope of the input/output characteristic constant. Therefore, according to this embodiment, it is possible to suppress a variation in the slope (resolution) of the input/output characteristic regardless of a variation in temperature or a variation in the characteristic of a transistor constituting the pulse delay circuit.

When A/D conversion is continuously repeated, the output time of the LP2 is stored in the memory circuit 51, thereby stopping the pulse delay circuit 12. Therefore, it is possible to reduce power consumption.

Sampling based on Vin and sampling based on Vmin are performed by the same pulse delay circuit, thereby reducing errors. For example, in the A/D conversion device 100 shown in FIG. 1, if the pulse delay circuit 11 and the pulse delay circuit 13 are different in their characteristics and the same analog voltage applied to them, delay of the pulse delay circuit 11 and the pulse delay circuit 13 are different, the characteristic difference between the pulse delay circuit 11 and the pulse delay circuit 13 appears as error.

Meanwhile, according to this embodiment, since the common pulse delay circuit is used for sampling twice, no error appears because of the characteristic difference of pulse delay circuits.

The pulse delay circuit and the pulse passage stage detection circuit for sampling twice are shared, thereby reducing the circuit size.

Although in this embodiment, the pulse delay circuit 14 in which the pulse delay circuit 11 and the pulse delay circuit 13 are shared is used, even when the pulse delay circuit 11 and the pulse delay circuit 12 are different in characteristic, since the difference in characteristic appears as errors, the pulse delay circuit 11 and the pulse delay circuit 12 may be shared.

In this embodiment, since the sampling time is detected before sampling based on Vin is performed, it is necessary to perform sampling based on Vmax and Vmin. For this reason, the time from when A/D conversion starts until the A/D conversion result of Vin is obtained is more delayed than in the first embodiment and the second embodiment. However, the circuit size becomes smaller than in the first embodiment and the second embodiment.

Although the embodiments of the invention have been described with reference to the drawings, a specific configuration of the invention is not limited to the foregoing embodiments, and design changes may be made without departing from the spirit of the invention. For example, although in the above description, it is assumed that Vin is within the voltage range of Vmax to Vmin, an analog input voltage outside the voltage range of Vmax to Vmin may be set to Vin, and A/D conversion may be performed in the same manner as described above.

What is claimed is:

1. An A/D conversion device which converts an analog input voltage to a digital value, the A/D conversion device comprising:

a first pulse delay circuit which receives a first pulse signal at a first time as input, and has multiple stages of delay units which are connected together and delay the first pulse signal for a delay period according to a magnitude of a first analog voltage;

a first pulse passage stage detection circuit which detects a first number of stages when the first pulse signal has passed through the delay unit in the first pulse delay circuit;

a second pulse delay circuit which receives a second pulse signal at a second time that is the same as the first time, and has multiple stages of delay units which are connected together and delay the second pulse signal for a delay period according to a magnitude of a second analog voltage different from the first analog voltage;

a second pulse passage stage detection circuit which detects a second number of stages when the second pulse signal has passed through a delay unit in the second pulse delay circuit;

a time output circuit which outputs a time signal indicating a time at which a difference between the first number of stages and the second number of stages becomes a predetermined number of stages;

a third pulse delay circuit which receives a third pulse signal at a third time as input, at a same time as the first time and the second time as input, and has delay units which are connected together and delay the third pulse signal for a delay period according to a magnitude of the analog input voltage;

a third pulse passage stage detection circuit which detects a third number of stages when the third pulse signal has passed through a delay unit in the third pulse delay circuit; and an output circuit which outputs the digital value corresponding to the third number of stages detected at a time indicated by the time signal.

2. The A/D conversion device according to claim 1, further comprising:

a memory circuit which stores a sampling time corresponding to the time indicated by the time signal, wherein the third pulse delay circuit further receives a fourth pulse signal at a fourth time after the first time, the second time, and the third time as input, the third pulse passage stage detection circuit further detects a fourth number of stages when the fourth pulse signal has passed through delay units in a fourth pulse delay circuit, and the output circuit further outputs the digital value corresponding to the fourth number of stages detected at a time at which the sampling time stored in the memory circuit has elapsed after the fourth pulse signal has been input.

3. The A/D conversion device according to claim 2, further comprising:

a control circuit which stops a operation of the first pulse delay circuit or the second pulse delay circuit after the sampling time has been stored in the memory circuit.

4. The A/D conversion device according to claim 2, further comprising:
a control circuit which stops the operations of the first pulse delay circuit and the second pulse delay circuit after the sampling time has been stored in the memory circuit.

* * * * *